United States Patent
Jia

(10) Patent No.: US 10,581,017 B2
(45) Date of Patent: Mar. 3, 2020

(54) OLED PACKAGING STRUCTURE AND MANUFACTURING METHOD THEREOF

(71) Applicants: BOE Technology Group Co., Ltd., Beijing (CN); Hefei Xinsheng Optoelectronics Technology Co., Ltd., Hefei (CN)

(72) Inventor: Wenbin Jia, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/993,098

(22) Filed: May 30, 2018

(65) Prior Publication Data

US 2019/0097173 A1  Mar. 28, 2019

(30) Foreign Application Priority Data

Sep. 25, 2017 (CN) .......................... 2017 1 0875607

(51) Int. Cl.
*H01L 21/00* (2006.01)
*H01L 51/52* (2006.01)
(Continued)

(52) U.S. Cl.
CPC ...... *H01L 51/5253* (2013.01); *H01L 51/0097* (2013.01); *H01L 51/56* (2013.01);
(Continued)

(58) Field of Classification Search
CPC . H01L 51/5253; H01L 51/0097; H01L 51/56; H01L 2251/301; H01L 2251/303; H01L 2251/5338; H01L 2251/558
See application file for complete search history.

(56) References Cited

U.S. PATENT DOCUMENTS

2016/0204374 A1  7/2016 Sonoda et al.
2017/0012237 A1  1/2017 Sun et al.
(Continued)

FOREIGN PATENT DOCUMENTS

CN    103943788 A    7/2014
CN    105493627 A    4/2016
(Continued)

OTHER PUBLICATIONS

Sep. 7, 2018—(CN) First Office Action Appn 201710875607.8 with English Translation.
(Continued)

*Primary Examiner* — Victor A Mandala
*Assistant Examiner* — Colleen E Snow
(74) *Attorney, Agent, or Firm* — Banner & Witcoff, Ltd.

(57) ABSTRACT

Embodiments of the present disclosure provide an organic light-emitting diode (OLED) packaging structure and a manufacturing method thereof. The OLED packaging structure includes: a substrate; an OLED, disposed on the substrate and including active and non-active display region; a packaging peripheral region, disposed on the substrate and packaging a portion except the OLED; a packaging region, disposed on the OLED and packaging the active display region of the OLED; and a packaging transition region, disposed between the packaging peripheral region and the packaging region and packaging the non-active display region of the OLED, wherein each of the three regions includes an packaging layer, and a thickness of the packaging layer of the packaging transition region is greater than the thickness of the packaging layer of the packaging peripheral region.

11 Claims, 4 Drawing Sheets

(51) Int. Cl.
 *H01L 51/00* (2006.01)
 *H01L 51/56* (2006.01)
(52) U.S. Cl.
 CPC .. *H01L 2251/301* (2013.01); *H01L 2251/303* (2013.01); *H01L 2251/5338* (2013.01); *H01L 2251/558* (2013.01)

(56) References Cited

U.S. PATENT DOCUMENTS

| | | |
|---|---|---|
| 2017/0020007 A1 | 1/2017 | Park et al. |
| 2017/0125734 A1 | 5/2017 | Lee et al. |
| 2018/0248153 A1 | 8/2018 | Cui |

FOREIGN PATENT DOCUMENTS

| | | |
|---|---|---|
| CN | 106328825 A | 1/2017 |
| CN | 106847760 A | 6/2017 |
| CN | 106847858 A | 6/2017 |
| CN | 106848087 A | 6/2017 |
| CN | 206282888 U | 6/2017 |
| CN | 106935593 A | 7/2017 |
| CN | 106997930 A | 8/2017 |

OTHER PUBLICATIONS

Apr. 29, 2019—(CN) Second Office Action Appn 201710875607.8 with English Translation.

OLED PACKAGING STRUCTURE AND MANUFACTURING METHOD THEREOF

CROSS-REFERENCE TO RELATED APPLICATION

This application claims priority to and the benefit of Chinese Patent Application No. 201710875607.8 filed on Sep. 28, 2017, which application is incorporated herein in its entirety.

TECHNICAL FIELD

The present disclosure relates to an organic light-emitting diode (OLED) packaging structure and a manufacturing method thereof.

BACKGROUND

With the development of science and technology, the technical field of display is changing with each passing day, and types of display technologies are also increasing, for instance, including a traditional liquid crystal display (LCD) technology, an OLED technology, an electrophoretic display technology, etc. Wherein, flexible organic light-emitting diode (FOLED) display technology has more advantages compared with other flexible displays, e.g., self-luminous display, rapid response speed, high brightness and wide viewing angle. FOLED is a display based on organic material, is not filled with liquid, may be curled, folded and even worn, and is a good portable product.

However, an OLED device is extremely sensitive to water and oxygen, and a small number of water and oxygen will reduce the performance of the device until failure, so OLED packaging is of vital importance to the OLED device. As an inorganic film has better water and oxygen resistance, the traditional OLED packaging mainly adopts inorganic film packaging in combination with organic packaging. However, as the inorganic packaging film is relatively hard, and during use, especially during a bending process of the flexible device, due to the stress problem, edges are prone to crack, thus resulting in packaging failure.

SUMMARY

Embodiments of the present disclosure provide an organic light-emitting diode (OLED) packaging structure and a manufacturing method thereof.

An embodiment of the present disclosure provides an organic light-emitting diode (OLED) packaging structure, which comprises: a substrate; an OLED, disposed on the substrate and including an active display region and a non-active display region on a periphery of the active display region; a packaging peripheral region, disposed on the substrate and configured to package a portion except the OLED; a packaging region, disposed on the OLED and configured to package the active display region of the OLED; and a packaging transition region, disposed between the packaging peripheral region and the packaging region and configured to package the non-active display region of the OLED, wherein each of the packaging peripheral region, the packaging region and the packaging transition region includes an packaging layer, and a thickness of the packaging layer of the packaging transition region is greater than the thickness of the packaging layer of the packaging peripheral region.

For example, a thickness of the packaging layer of the packaging region is greater than the thickness of the packaging layer of the packaging transition region.

For example, the packaging peripheral region includes a first packaging layer; the packaging transition region includes the first packaging layer and a second packaging layer disposed on the first packaging layer; and the packaging region includes the first packaging layer, the second packaging layer disposed on the first packaging layer, and a third packaging layer disposed on the second packaging layer.

For example, a thickness of the first packaging layer is 5 to 10 times a thickness of the second packaging layer, and the thickness of the second packaging layer is 1 to 3 times a thickness of the third packaging layer.

For example, materials of the first packaging layer, the second packaging layer and the third packaging layer are any one or a combination of silicon nitride, aluminum oxide and silicon oxynitride.

For example, materials of the first packaging layer, the second packaging layer and the third packaging layer are identical.

For example, the packaging peripheral region includes a first packaging layer; and the packaging transition region and the packaging region include the first packaging layer and a second packaging layer disposed on the first packaging layer.

An embodiment of the present disclosure provides a method for manufacturing an OLED packaging structure, the OLED packaging structure includes: a substrate; an OLED, disposed on the substrate and including an active display region and a non-active display region surrounding the active display region; a packaging peripheral region, disposed on the substrate and configured to package a portion except the OLED; an packaging region, disposed on the OLED and configured to package the active display region of the OLED; and a packaging transition region, disposed between the packaging peripheral region and the packaging region and configured to package the non-active display region of the OLED, and the method comprises: forming a first packaging layer in the packaging region, the packaging transition region and the packaging peripheral region; and forming a second packaging layer in the packaging region and the packaging transition region.

For example, the method for manufacturing the OLED packaging structure further comprises forming a third packaging layer in the packaging region.

For example, the forming the second packaging layer in the packaging region and the packaging transition region includes: by using a mask to cover the packaging peripheral region, forming the second packaging layer in the packaging region and the packaging transition region by deposition.

For example, the forming the third packaging layer in the packaging region includes: by using a mask to cover the packaging transition region and the packaging peripheral region, and forming the third packaging layer in the packaging region by deposition.

For example, a thickness of the first packaging layer is 5 to 10 times a thickness of the second packaging layer; and the thickness of the second packaging layer is 1 to 3 times a thickness of the third packaging layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

Figure 1:
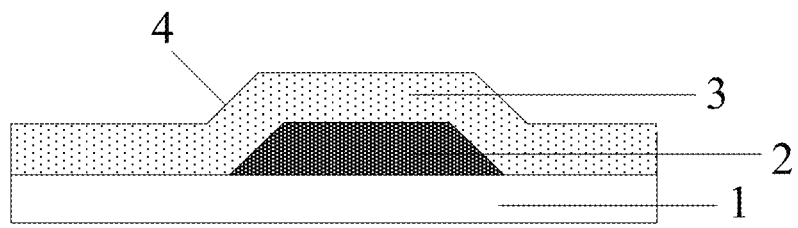
FIG. 1 is a schematic structural view of an OLED packaging structure.

In an OLED packaging process, an adopted method is to form an OLED element on a substrate, perform a deposition by disposing the substrate in a deposition chamber, deposit one layer of inorganic film on the substrate and the OLED, and form an OLED packaging structure in which the inorganic film covers the OLED. The obtained packaging structure is as shown in FIG. 1. In FIG. 1, the packaging structure comprises a substrate 1, an OLED 2 on the substrate 1, and an inorganic film 3 for covering the OLED 2. In the packaging structure, a thickness of the inorganic film 3 for covering various parts of the OLED is same. As the OLED element has a certain thickness, the result is that a stress in a region in which an edge portion of the OLED is located, that is, a packaging transition region (as shown by 4 in FIG. 1) is easily concentrated, and the break will happen, thus affecting the yield of the OLED packaging structure.

The present disclosure provides an OLED packaging structure and a manufacturing method thereof as described below.

A First Embodiment

Figure 2:
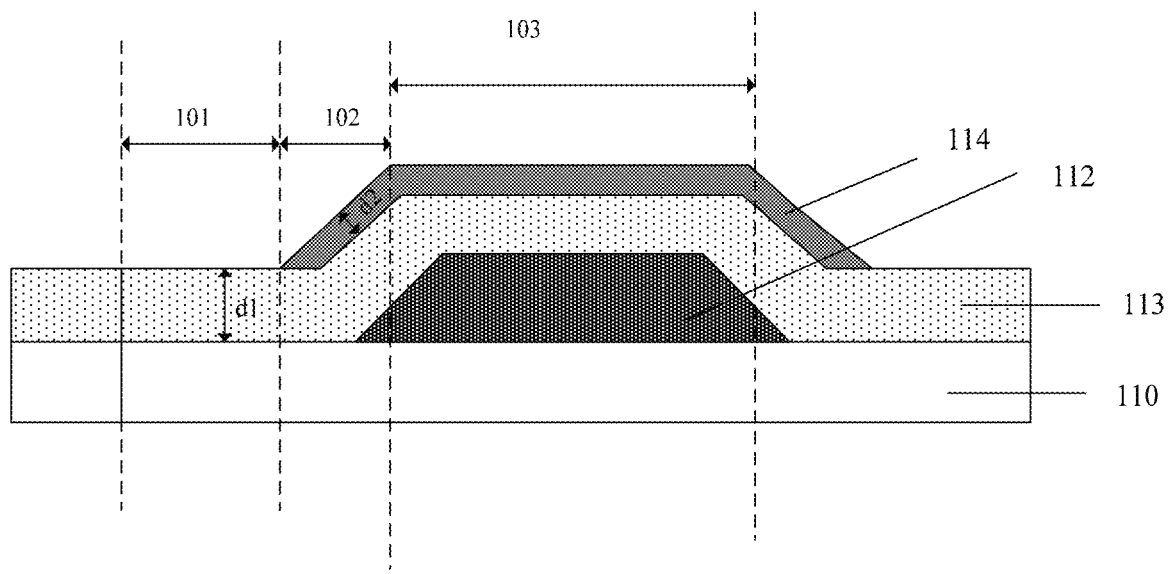
FIG. 2 is a schematic structural view of an OLED packaging structure provided by an embodiment of the present disclosure.

The embodiment provides an OLED packaging structure. FIG. 2 is a schematic structural view of the OLED packaging structure provided by the embodiment of the present disclosure.

As shown in FIG. 2, the OLED packaging structure comprises a substrate 110, an OLED 112 being disposed on the substrate 110 and including an active display region and non-active display region on a periphery of the active display region, a first packaging layer 113 disposed on the substrate 110 and the OLED 112, and a second packaging layer 114 disposed on the first packaging layer 113.

The OLED packaging structure includes three regions: a packaging peripheral region 101 disposed on the substrate 110 and configured to package a portion outside the OLED 112; a packaging region disposed on the OLED 112 and configured to package the active display region of the OLED; and a packaging transition region 102 disposed between the packaging peripheral region and the packaging region and configured to package the non-active display region of the OLED 2, namely an edge region of the OLED 2.

The packaging peripheral region 101, the packaging region 103 and the packaging transition region 102 respectively include a packaging layer. In FIG. 2, the packaging peripheral region includes the first packaging layer 113; the packaging transition region and the packaging region include the first packaging layer 113 and the second packaging layer 114; a thickness of the first packaging layer 113 is d1; and a thickness of the second packaging layer 114 is d2.

Therefore, the thickness of the packaging layer of the packaging peripheral region 101 is d1; the thickness of the packaging layer of the packaging transition region 102 is d1+d2; and the thickness of the packaging layer of the packaging transition region 102 is greater than the thickness of the packaging layer of the packaging peripheral region 101.

By additionally forming one packaging layer on the packaging layer of the packaging transition region 102, the thicknesses of the packaging layers of the packaging transition region and the packaging peripheral region are different, so as to reduce the stress concentration of the packaging transition region and reduce the fracture risk of the packaging structure. In the embodiment, the thickness of the packaging transition region is increased by additionally forming the packaging layer on the packaging layer of the packaging transition region, and other means may also be adopted so that the thickness of the packaging layer of the packaging transition region is greater than the thickness of the packaging peripheral region.

Figure 3:
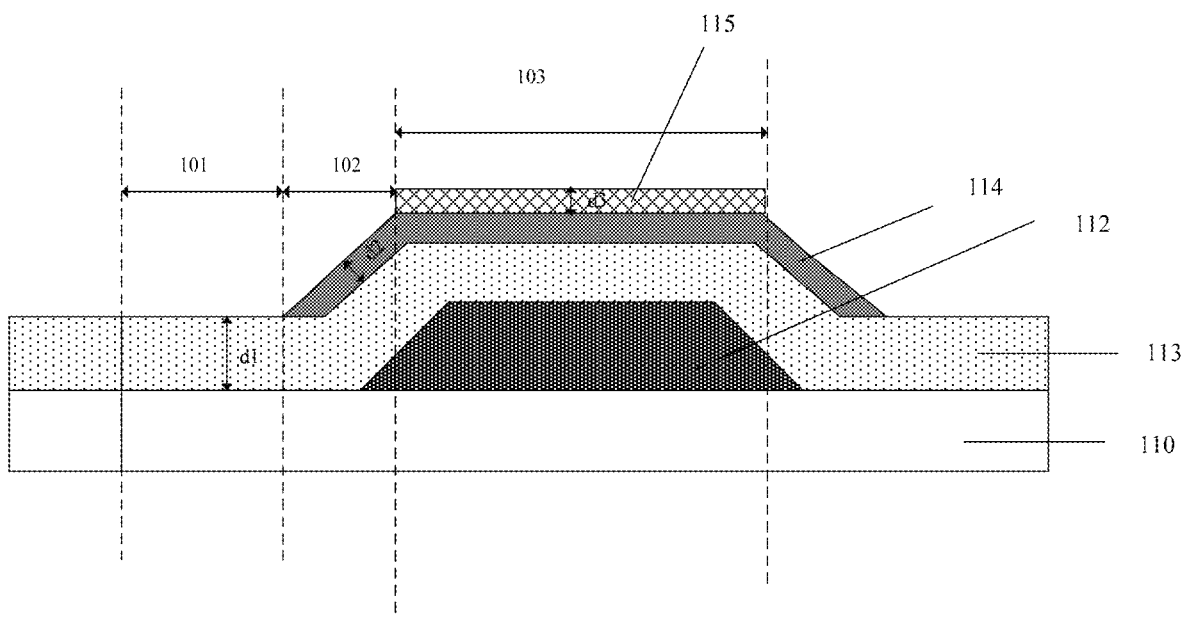
FIG. 3 is a schematic structural view of another OLED packaging structure provided by an embodiment of the present disclosure.

FIG. 3 is a schematic structural view of another OLED packaging structure provided by the embodiment of the present disclosure. In another embodiment, as shown in FIG. 3, the OLED packaging structure further comprises a third packaging layer 115 on the second packaging layer 114.

In this case, the packaging peripheral region includes the first packaging layer 113; the packaging transition region includes the first packaging layer 113 and the second packaging layer 114; and the packaging region includes the first packaging layer 113, the second packaging layer 114 and the third packaging layer 115. The thickness of the first packaging layer 113 of the packaging region is d1; the thickness of the second packaging layer 114 is d2; and the thickness of the third packaging layer 115 is d3.

Therefore, the thickness of the packaging layer of the packaging peripheral region 101 is d1; the thickness of the packaging layer of the packaging transition region 102 is d1+d2; and the thickness of the packaging layer of the packaging region 103 is d1+d2+d3. Thus, not only the thickness of the packaging layer of the packaging transition region 102 is greater than the thickness of the packaging layer of the packaging peripheral region 101 but also the thickness of the packaging layer of the packaging region 103 is greater than the thickness of the packaging layer of the packaging transition region 102.

By additionally forming one packaging layer on the packaging layer of the packaging transition region and further forming one packaging layer on the packaging layer of the packaging region, thicknesses of the packaging layers of the packaging transition region and the packaging peripheral region are different, the stress concentration of the packaging transition region can be reduced, the fracture risk of the packaging structure can be reduced, the packaging effect of the packaging region can be further improved, and the packaging reliability of the OLED can be improved by better packaging the active display region of the OLED because the packaging region packages the active display region, namely a key region of the OLED.

In the embodiment, the thickness of the first packaging layer 113 is 5 to 10 times that of the second packaging layer 114, and the thickness of the second packaging layer 114 is 1 to 3 times that of the third packaging layer 115. For instance, the thickness of the first packaging layer 113 is 1 µm; the thickness of the second packaging layer 114 may be 0.1 µm; and the thickness of the third packaging layer 115 may be 0.1 µm.

A material of the first packaging layer 113, the second packaging layer 114 and the third packaging layer 115 is any one or a combination selected from a group consisting of silicon nitride, aluminum oxide and silicon oxynitride. The materials of the first packaging layer, the second packaging layer and the third packaging layer may be same and may also be different. In order to reduce the impact of different thermal expansion properties of the film layers on the packaging structure, the materials of the first packaging layer, the second packaging layer and the third packaging layer may be same.

In the embodiment, different thicknesses of the packaging layers of the packaging peripheral region, the packaging transition region and the packaging region can reduce the stress concentration of the packaging transition region, reduce the fracture risk of the packaging structure, and meanwhile, can also enhance the packaging effect of the packaging region and improve the packaging reliability of the OLED.

In the embodiment, the packaging peripheral region covers a portion outside the OLED on the substrate, and in actual process, needs also to cover a metal cathode (not shown in FIGS. 2 and 3) of the OLED; the packaging region needs to cover the active display region including a dummy region (an virtual testing region) of the OLED; and the packaging transition region is a transition region between the packaging peripheral region and the packaging region and needs to package and cover the non-active display region of the OLED. The present disclosure improves the packaging reliability of the OLED by adoption of different packaging thicknesses in the third regions.

A Second Embodiment

Figure 4:
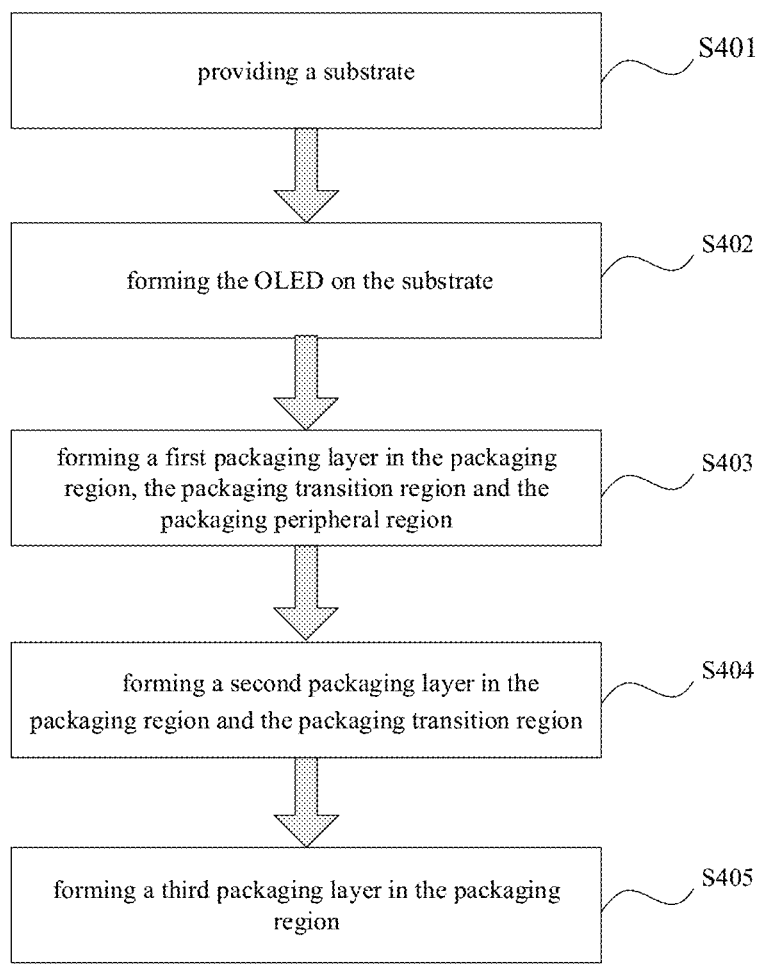
FIG. 4 is a flow chart of a method for manufacturing an OLED packaging structure provided by an embodiment of the present disclosure.

The embodiment provides a method for manufacturing an OLED packaging structure. FIG. 4 is a flow chart of the method for manufacturing the OLED packaging structure provided by the embodiment of the present disclosure.

The OLED packaging structure provided by the embodiment comprises: a substrate; an OLED disposed on the substrate and including an active display region and a non-active display region surrounding the active display region; a packaging peripheral region disposed on the substrate and configured to package a portion outside the OLED; an packaging region disposed on the OLED and configured to package the active display region of the OLED; and a packaging transition region disposed between the packaging peripheral region and the packaging region and configured to package the non-active display region of the OLED.

As shown in FIG. 4, the method for manufacturing the OLED packaging structure comprises the following steps.

S401: providing a substrate.

S402: forming the OLED on the substrate.

S403: forming a first packaging layer in the packaging region, the packaging transition region and the packaging peripheral region.

Figure 5:
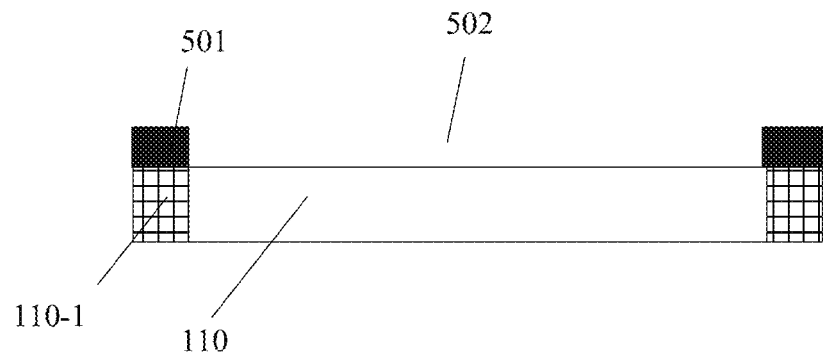
FIGS. 5 to 7 are schematic diagrams illustrating steps of the method for manufacturing the OLED packaging structure provided by an embodiment of the present disclosure.

In the step, the process of forming the first packaging layer is as follows: as shown in FIG. 5, adopting a mask 501 to cover a portion 110-1 in which no inorganic film is required to be deposited on the substrate 110, placing the substrate in a chemical vapor deposition (CVD) or atomic layer deposition (ALD) chamber, and depositing an inorganic film with a thickness of d1 in the packaging peripheral region 101, the packaging transition region 102 and the packaging region 103 (the OLED is not shown in the figure) exposed by an opening 502 of the mask 501. The inorganic film is any one or a combination selected from the group consisting of SiNx, $Al_2O_3$ and silicon oxynitride. The inorganic film is formed in the packaging region, the packaging transition region and the packaging peripheral region.

S404: forming a second packaging layer in the packaging region and the packaging transition region.

Figure 6:
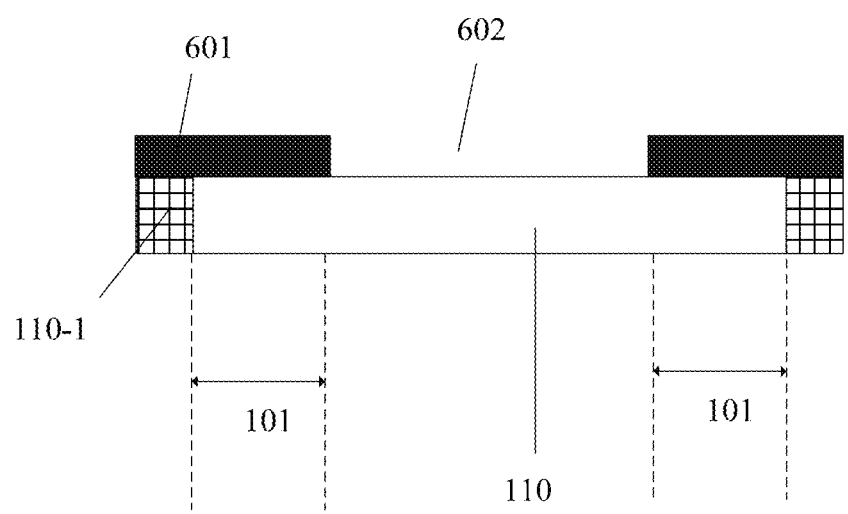

In the step, the illustrative process of forming the second packaging layer is as follows: as shown in FIG. 6, adopting a mask 601 to cover the portion 110-1 in which no inorganic film is required to be deposited and the packaging peripheral region 101 on the substrate 110, placing the substrate in a CVD or ALD chamber, and depositing an inorganic film with a thickness of d2 in the packaging transition region 102 and the packaging region 103 (the OLED is not shown in the figure) exposed by an opening 602 of the mask 601. An area of the opening 602 of the mask 601 is less than that of the opening 502 of the mask 501 in FIG. 5. The inorganic film is any one or a combination selected from the group consisting of SiNx, $Al_2O_3$ and silicon oxynitride. The inorganic film is formed in the packaging transition region and the packaging region.

Figure 7:
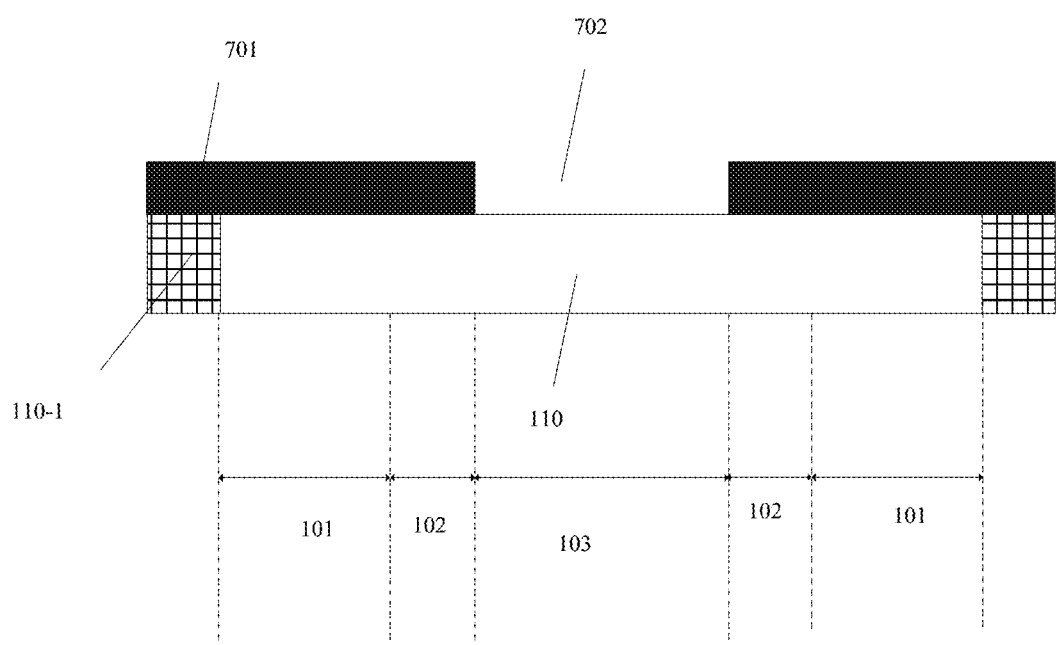

S405: forming a third packaging layer in the packaging region. In the step, the illustrative process of forming the third packaging layer is as follows: as shown in FIG. 7, adopting a mask 701 to cover the portion 110-1, in which no inorganic film is required to be deposited, the packaging peripheral region 101 and the packaging transition region 102 on the substrate 110, placing the substrate in a CVD or ALD chamber, and depositing an inorganic film with a thickness of d3 in the packaging region 103 (the OLED is not shown in the figure) exposed by an opening 702 of the mask 701. An area of the opening 702 of the mask 701 is less than that of the opening 602 of the mask 601 in FIG. 6. The inorganic film is any one or a combination selected from the group consisting of SiNx, $Al_2O_3$ and silicon oxynitride. The inorganic film is formed in the packaging region.

The thickness of the first packaging layer is 5 to 10 times that of the second packaging layer, and the thickness of the second packaging layer is 1 to 3 times that of the third packaging layer.

In the embodiment, the packaging peripheral region covers a portion outside the OLED on the substrate, and in actual process, needs also to cover a metal cathode (not shown in FIGS. 2 and 3) of the OLED; the packaging region needs to cover the active display region including a dummy region of the OLED; and the packaging transition region is a transition region between the packaging peripheral region and the packaging region and needs to package and cover the non-active display region of the OLED. The present disclosure improves the packaging reliability of the OLED by adoption of different packaging thicknesses in the third regions.

In the embodiment, different thicknesses of the packaging layers of the packaging peripheral region, the packaging transition region and the packaging region, obtained as the masks cover different regions, can reduce the stress concentration of the packaging transition region, reduce the fracture risk of the packaging structure, and meanwhile, can also enhance the packaging effect of the packaging region and improve the packaging reliability of the OLED.

What are described above is related to the specific embodiments of the disclosure only and not limitative to the scope of the disclosure. The protection scope of the disclosure shall be based on the protection scope of the claims.

The application claims priority to the Chinese patent application No. 201710875607.8, filed Sep. 25, 2017, the disclosure of which is incorporated herein by reference as part of the application.

The invention claimed is:

1. An organic light-emitting diode (OLED) packaging structure, comprising:
   a substrate;
   an OLED, disposed on the substrate and including an active display region and a non-active display region on a periphery of the active display region;
   a packaging peripheral region, disposed on the substrate and configured to package a portion except for the OLED;
   a packaging region, disposed on the OLED and configured to package the active display region of the OLED; and
   a packaging transition region, disposed between the packaging peripheral region and the packaging region and configured to package the non-active display region of the OLED,
   wherein each of the packaging peripheral region, the packaging region, and the packaging transition region includes a packaging layer, and a thickness of the packaging layer of the packaging transition region is greater than a thickness of the packaging layer of the packaging peripheral region,
   wherein a thickness of the packaging layer of the packaging region is greater than the thickness of the packaging layer of the packaging transition region.

2. The OLED packaging structure according to claim 1, wherein the packaging peripheral region includes a first packaging layer; the packaging transition region includes the first packaging layer and a second packaging layer disposed on the first packaging layer; and the packaging region includes the first packaging layer, the second packaging layer disposed on the first packaging layer, and a third packaging layer disposed on the second packaging layer.

3. The OLED packaging structure according to claim 2, wherein a thickness of the first packaging layer is 5 to 10 times a thickness of the second packaging layer, and the thickness of the second packaging layer is 1 to 3 times a thickness of the third packaging layer.

4. The OLED packaging structure according to claim 2, wherein materials of the first packaging layer, the second packaging layer, and the third packaging layer are any one or a combination of silicon nitride, aluminum oxide, and silicon oxynitride.

5. The OLED packaging structure according to claim 2, wherein materials of the first packaging layer, the second packaging layer, and the third packaging layer are identical.

6. The OLED packaging structure according to claim 1, wherein the packaging peripheral region includes a first packaging layer; and the packaging transition region and the packaging region include the first packaging layer and a second packaging layer disposed on the first packaging layer.

7. A method for manufacturing an organic light-emitting diode (OLED) packaging structure, wherein the OLED packaging structure includes: a substrate; an OLED, disposed on the substrate and including an active display region and a non-active display region surrounding the active display region; a packaging peripheral region, disposed on the substrate and configured to package a portion except for the OLED; a packaging region, disposed on the OLED and configured to package the active display region of the OLED; and a packaging transition region, disposed between the packaging peripheral region and the packaging region and configured to package the non-active display region of the OLED, and
   the method comprises:
   forming a first packaging layer in the packaging region, the packaging transition region, and the packaging peripheral region; and
   forming a second packaging layer in the packaging region and the packaging transition region,
   wherein a thickness of the packaging layers of the packaging transition region is greater than a thickness of the packaging layer of the packaging peripheral region, and
   a thickness of the packaging layers of the packaging region is greater than the thickness of the packaging layers of the packaging transition region.

8. The method for manufacturing the OLED packaging structure according to claim 7, further comprising:
   forming a third packaging layer in the packaging region.

9. The method for manufacturing the OLED packaging structure according to claim 8, wherein the forming the third packaging layer in the packaging region includes:
   using a mask to cover the packaging transition region and the packaging peripheral region, forming the third packaging layer in the packaging region by deposition.

10. The method for manufacturing the OLED packaging structure according to claim 8, wherein a thickness of the first packaging layer is 5 to 10 times a thickness of the second packaging layer; and the thickness of the second packaging layer is 1 to 3 times a thickness of the third packaging layer.

11. The method for manufacturing the OLED packaging structure according to claim 7, wherein the forming the second packaging layer in the packaging region and the packaging transition region includes:
    using a mask to cover the packaging peripheral region, forming the second packaging layer in the packaging region and the packaging transition region by deposition.

\* \* \* \* \*